United States Patent
Chen et al.

(10) Patent No.: US 10,503,578 B2
(45) Date of Patent: Dec. 10, 2019

(54) ON-CHIP TDDB DEGRADATION MONITORING AND FAILURE EARLY WARNING CIRCUIT FOR SOC

(71) Applicant: Fifth Electronics Research Institute of Ministry of Industry and Information Technology, Guangzhou (CN)

(72) Inventors: Yiqiang Chen, Guangzhou (CN); Dengyun Lei, Guangzhou (CN); Yunfei En, Guangzhou (CN); Wenxiao Fang, Guangzhou (CN); Lichao Hao, Guangzhou (CN); Yun Huang, Guangzhou (CN); Bo Hou, Guangzhou (CN); Yudong Lu, Guangzhou (CN)

(73) Assignee: Fifth Electronics Research Institute of Ministry of Industry and Information Technology (CN)

( * ) Notice: Subject to any disclaimer, the term of this patent is extended or adjusted under 35 U.S.C. 154(b) by 0 days.

(21) Appl. No.: 15/556,751

(22) PCT Filed: Nov. 29, 2016

(86) PCT No.: PCT/CN2016/107700
§ 371 (c)(1),
(2) Date: Sep. 8, 2017

(87) PCT Pub. No.: WO2018/040327
PCT Pub. Date: Mar. 8, 2018

(65) Prior Publication Data
US 2019/0205196 A1 Jul. 4, 2019

(30) Foreign Application Priority Data
Aug. 30, 2016 (CN) .......................... 2016 1 0777409

(51) Int. Cl.
*G06F 11/00* (2006.01)
*G06F 11/07* (2006.01)
(Continued)

(52) U.S. Cl.
CPC ........ *G06F 11/079* (2013.01); *G01R 31/3177* (2013.01); *G06F 11/0736* (2013.01);
(Continued)

(58) Field of Classification Search
None
See application file for complete search history.

(56) References Cited

U.S. PATENT DOCUMENTS 5,420,505 A 5/1995 Kondo
6,327,687 B1 * 12/2001 Rajski ............ G01R 31/318335
714/738
(Continued)

FOREIGN PATENT DOCUMENTS

CN 1815752 A 8/2006
CN 101702005 A 5/2010
(Continued)

OTHER PUBLICATIONS

International Search Report for Application No. PCT/CN2016/107700 dated Jun. 8, 2017, 5 pages.
(Continued)

*Primary Examiner* — Mujtaba M Chaudry
(74) *Attorney, Agent, or Firm* — Lerner, David, Littenberg, Krumholz & Mentlik, LLP (57) ABSTRACT

An on-chip TDDB degradation monitoring and failure early warning circuit for SoC. A control circuit module converts Q1 and Q0 signals into a switch state control signal and outputs the switch state control signal to a digital conversion module for TDDB performance degradation. A MOS transistor of a first MOS transistor circuit within the digital
(Continued)

conversion module for TDDB performance degradation is in a stress state of a supply voltage, and a MOS transistor of a second MOS transistor circuit is in a non-stress state. The first and second MOS transistor circuits output a first frequency value and a second frequency value to the output selection module. The output selection module outputs the first frequency value from the digital conversion module to the counter B for recording, or outputs the second frequency value to the counter A for recording. The counter module determines the degradation level of TDDB performance.

10 Claims, 4 Drawing Sheets

(51) Int. Cl.
    *G01R 31/3177* (2006.01)
    *G06F 11/30* (2006.01)
    *G06F 11/34* (2006.01)

(52) U.S. Cl.
    CPC ...... *G06F 11/0754* (2013.01); *G06F 11/3013* (2013.01); *G06F 11/3495* (2013.01)

(56) References Cited

U.S. PATENT DOCUMENTS 6,781,401 B2     8/2004    Kim

| | | |
|---|---|---|
| 2005/0212547 A1 | 9/2005 | Suzuki |
| 2006/0131672 A1 | 6/2006 | Wang et al. |
| 2008/0038851 A1 | 2/2008 | Koyama et al. |
| 2013/0103351 A1 | 4/2013 | Huang et al. |
| 2014/0096098 A1* | 4/2014 | Weir .................. G06F 17/5009 716/112 |
| 2014/0306687 A1* | 10/2014 | Ahmadi .......... G01R 31/31727 324/76.11 |
| 2015/0035084 A1* | 2/2015 | Li .................... H01L 29/66545 257/410 |

FOREIGN PATENT DOCUMENTS

| | | |
|---|---|---|
| CN | 1997906 B | 11/2010 |
| CN | 202421432 U | 9/2012 |
| CN | 103063995 A | 4/2013 |
| CN | 103217637 A | 7/2013 |
| CN | 103698692 A | 4/2014 |
| CN | 105738789 A | 7/2016 |

OTHER PUBLICATIONS

Search Report for Chinese Priority Application 201610777409.3, filed on Feb. 22, 2019.

First Office Action for Chinese Priority Application 201610777409.3, filed on Feb. 22, 2019.

* cited by examiner

ON-CHIP TDDB DEGRADATION MONITORING AND FAILURE EARLY WARNING CIRCUIT FOR SOC

CROSS REFERENCE TO RELATED APPLICATIONS

The present application is a national phase entry under 35 U.S.C. § 371 of International Application No. PCT/CN2016/107700, filed Nov. 29, 2016, which claims priority from Chinese Patent Application No. 201610777409.3 filed Aug. 30, 2016, all of which are hereby incorporated herein by reference.

FIELD

The present disclosure relates to the field of electronic system monitoring technology, and more particularly, to an on-chip TDDB degradation monitoring and failure early warning circuit for system-on-chip (SoC).

BACKGROUND

As complex electronic systems develop towards to microminiaturization, high integration and multifunction, the SoC has been created and widely applied in the fields of aviation and aerospace, rail transportation, nuclear power and other technical fields requiring high reliability. However, as the feature size of semiconductor devices is constantly scaling down, the thickness of the gate oxide is continually thinned, whereas the supply voltage should not be reduced, so the gate oxide reliability of transistors in the SoC under high electric intensity has become a prominent problem. The degradation of the gate oxide will cause a threshold voltage shift, a decrease in transconductance, and an increase in leakage current, which may further cause a failure caused by breakdown of the gate oxide, is the so-called time dependent dielectric breakdown (TDDB) failure. Therefore, it is crucial to guarantee reliability of SoC effectively.

Traditional off-line reliability assessment methods, such as reliability simulation, process online detection, reliability test and failure analysis, etc., cannot predict the service life of the device in real time. The on-chip prognostic method based on prognostic cells can add a vulnerable unit into a host circuit according to a circuit failure mechanism, so that the vulnerable unit fails prior to the host circuit to provide a warning to ensure the security of the host circuit. That is, the failure early warning for the host circuit can be generated in real-time.

Figure 1:
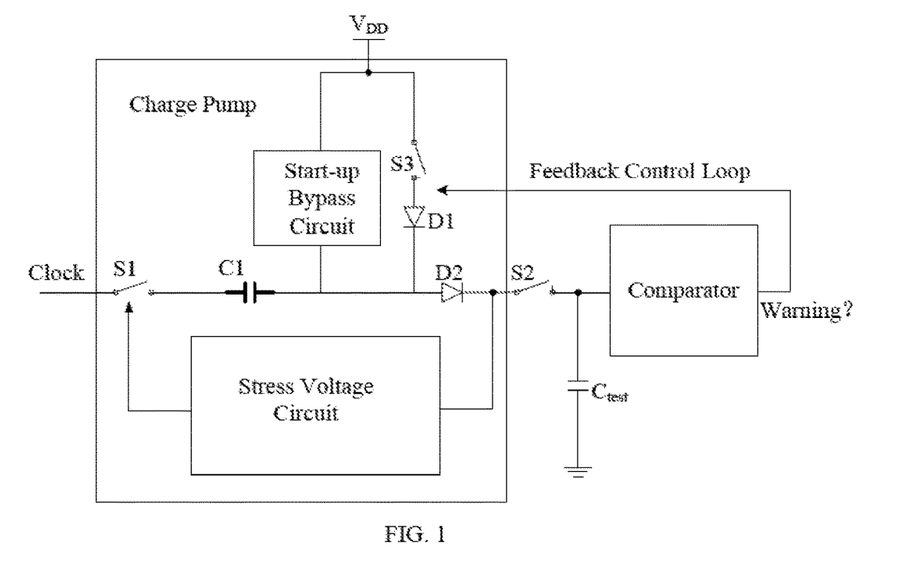
FIG. 1 is a block diagram of an existing TDDB failure early warning circuit.

An existing TDDB failure prognostic circuit, as shown in FIG. 1, includes a charge pump made up of diodes D1 and D2, a start-up bypass circuit, a stress voltage circuit and a capacitor C1. In an initial state, a switch S2 is switched on and a test capacitor $C_{test}$ is in an overvoltage condition. If the test capacitor $C_{test}$ fails, a comparator outputs a low level voltage, and then outputs an early warning signal, while a feedback loop controls to be switched off a switch S3 to cut off the charge pump.

However, such circuit has the following drawbacks.

(1) It is only applicable to a CMOS hybrid integrated circuit.

(2) The output module of the comparator is also under stress, which may cause stress TDDB failure breakdown, and cause false alarm.

(3) The output of the circuit has only the warning function from "0" to "1" or from "1" to "0", therefore the degradation process of the performance cannot be monitored.

In summary, the above-mentioned TDDB failure prognostic circuit has a risk that the accuracy of the early warning is poor, and the degradation process of the performance cannot be monitored.

SUMMARY

In view of the above, it is necessary to provide an on-chip TDDB degradation monitoring and failure early warning circuit for the above technical problems.

An on-chip TDDB degradation monitoring and failure early warning circuit for SoC is provided, including: a timing logic module, a control circuit module, a digital conversion module for TDDB performance degradation, an output selection module and a counter module, wherein the counter module includes a counter A and a counter B; the digital conversion module for TDDB performance degradation includes two same MOS transistor circuits including a first MOS transistor circuit and a second MOS transistor circuit;

the timing logic module includes X, Y and CP input terminals and Q1 and Q0 output terminals, and the timing logic module is configured to output Q1 and Q0 signals with a high or low level voltage to the control circuit module under control of input X, Y and CP signals;

the control circuit module is configured to convert the Q1 and Q0 signals into a switch state control signal and outputs the switch state control signal to the digital conversion module for TDDB performance degradation;

a MOS transistor of the first MOS transistor circuit is in a stress state of a supply voltage and a MOS transistor of the second MOS transistor circuit is in a non-stress state within the digital conversion module for TDDB performance degradation; the first and second MOS transistor circuits output a first and second frequency value to the output selection module respectively, under control of the switch state control signal;

the output selection module is configured to output the first frequency value from the digital conversion module for TDDB performance degradation to the counter B for recording, or output the second frequency value from the digital conversion module for TDDB performance degradation to the counter A for recording; and the counter module is configured to determine a degradation level of TDDB performance by comparing the first frequency value with the second frequency value.

For the above on-chip TDDB degradation monitoring and failure early warning circuit for SoC, the MOS transistor of the first MOS transistor circuit and the MOS transistor of the second MOS transistor circuit have a same frequency value in an initial phase. Since the MOS transistor of the first MOS transistor circuit is under the action of the supply voltage VDD stress over time and the grid capacitance tends to cause TDDB degradation, while no supply voltage stress is applied on the MOS transistor of the second MOS transistor circuit and there is no TDDB degradation, the second frequency value is less than the first frequency value. The property of the TDDB performance degradation can be accurately obtained by comparing the second frequency value in the counter A and the first frequency value in the counter B. The on-chip TDDB degradation monitoring and failure early warning circuit for SoC is particularly applied to the SoC chip with high integration and high reliability requirements. In addition, the circuit is simple in structure. The process of the TDDB performance degradation can be monitored base on the output of the circuit, so an accurate early warning can be performed for the TDDB performance.

DETAILED DESCRIPTION

Embodiments of the on-chip TDDB degradation monitoring and failure early warning circuit for SoC according to the present disclosure will be described below taken in conjunction with the accompanying drawings.

Figure 2:
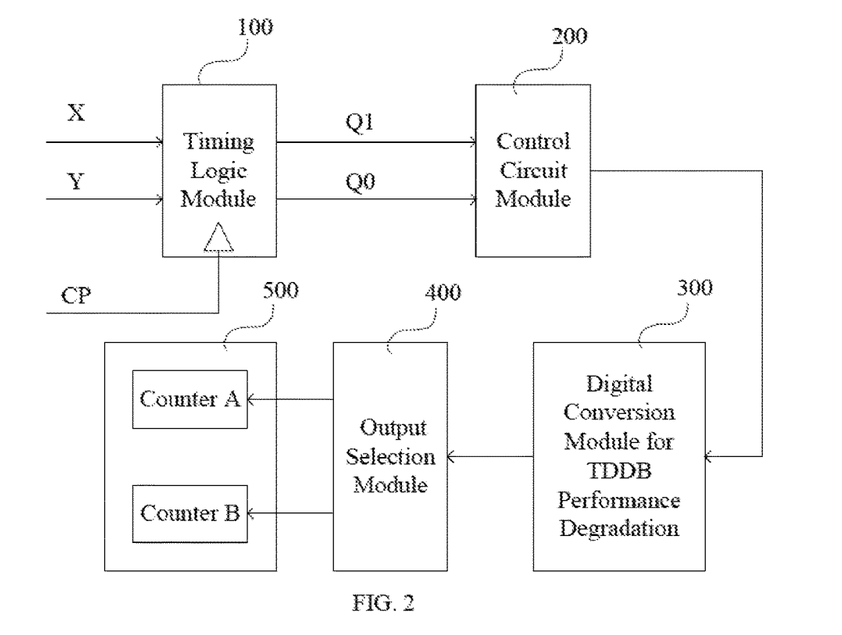
FIG. 2 is a block diagram of an on-chip TDDB degradation monitoring and failure early warning circuit for SoC.

FIG. 2 is a block diagram of an on-chip TDDB degradation monitoring and failure early warning circuit for SoC according to the present disclosure. The on-chip TDDB degradation monitoring and failure early warning circuit for SoC includes:

a timing logic module 100, a control circuit module 200, a digital conversion module for TDDB performance degradation 300, an output selection module 400 and a counter module 500. The counter module 500 includes a counter A and a counter B. The digital conversion module for TDDB performance degradation 300 includes two same MOS transistor circuits, a first MOS transistor circuit and a second MOS transistor circuit.

The timing logic module 100 includes X, Y and CP signal input terminals, Q1 and Q0 output terminals, and the timing logic module 100 is configured to output Q1 and Q0 signals with a high or low level voltage to the control circuit module 200 under control of the input X signal, Y signal and CP (Clock Pulse) signal. The X signal and the Y signal may be a signal with a high or low level voltage, and the CP signal is a pulse signal.

The control circuit module 200 is configured to convert the Q1 and Q0 signals into a switch state control signal, and output this switch state control signal to the digital conversion module for TDDB performance degradation 300. Q1 and Q0 may be a signal with a high or low level voltage.

A MOS transistor of the first MOS transistor circuit is in a stress state of a supply voltage and a MOS transistor of the second MOS transistor circuit is in a non-stress state within the digital conversion module for TDDB performance degradation 300. The first MOS transistor circuit and the second MOS transistor circuit output a first frequency value and a second frequency value to the output selection module 400 respectively, under control of the switch state control signal.

The output selection module 400 is configured to output the first frequency value from the digital conversion module for TDDB performance degradation 300 to the counter B for recording, or output the second frequency value from the digital conversion module for TDDB performance degradation 300 to the counter A for recording.

The counter module 500 is configured to determine a degradation level of TDDB performance by comparing the first frequency value with the second frequency value.

For the above on-chip TDDB degradation monitoring and failure early warning circuit for SoC, the MOS transistor of the first MOS transistor circuit and the MOS transistor of the second MOS transistor circuit have a same frequency value in an initial phase. Since the MOS transistor of the first MOS transistor circuit is under the action of the supply voltage VDD stress over time and the grid capacitance tends to cause TDDB degradation, while no supply voltage stress is applied on the MOS transistor of the second MOS transistor circuit and there is no TDDB degradation, the second frequency value is less than the first frequency value. The property of the TDDB performance degradation can be accurately obtained by comparing the second frequency value in the counter A and the first frequency value in the counter B. The on-chip TDDB degradation monitoring and failure early warning circuit for SoC is particularly applied to the SoC chip with high integration and high reliability requirements. In addition, the circuit is simple in structure. The process of the TDDB performance degradation can be monitored base on the output of the circuit, so an accurate early warning can be performed for the TDDB performance.

In one embodiment, the Q1 and Q0 signals correspond to a state selected from one of a S0 state, a S1 state, a S2 state, and a S3 state. When the Q1 output terminal is "0" and the Q0 output terminal is "0", the S0 state is the corresponding state; when the Q1 output terminal is "0" and the Q0 output terminal is "1", the S1 state is the corresponding state; when the Q1 output terminal is "1" and the Q0 output terminal is "0", the S2 state is the corresponding state; and when the Q1 output terminal is "1" and the Q0 output terminal is "1", the S3 state is the corresponding state.

Figure 3:
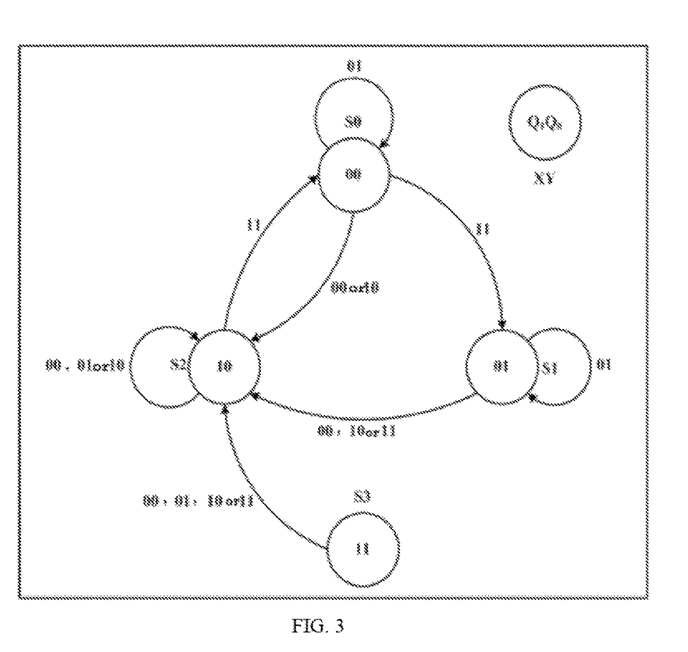
FIG. 3 is a state transition diagram of a timing logic module.

In one embodiment, as shown in FIG. 3, it shows a state transition diagram of a timing logic module. When the timing logic module 100 is in the S3 state, the timing logic module (100) is switched to the S2 state under any level voltage input from the X and Y input terminals;

when the timing logic module 100 is in the S2 state and a combination of signals input into the X and Y input terminals is any one of "00", "01", and "10", the timing logic module (100) continues to be in the S2 state;

when the timing logic module 100 is in the S2 state and the combination of signals input into the X and Y input terminals is "11", the timing logic module 100 is switched to the S0 state from the S2 state;

when the timing logic module 100 is in the S0 state and the combination of signals input into the X and Y input terminals is "01", the timing logic module 100 continues to be in the S2 state;

when the timing logic module 100 is in the S0 state and the combination of signals input into the X and Y input terminals is "00" or "10", the timing logic module 100 is switched to the S2 state from the S0 state;

when the timing logic module 100 is in the S0 state and the combination of signals input into the X and Y input terminals is "11", the timing logic module 100 is switched to the S1 state from the S0 state;

when the timing logic module 100 is in the S1 state and the combination of signals input into the X and Y input terminals is "01", the timing logic module 100 continues to be in the S1 state; and when the timing logic module 100 is in the S1 state and the combination of signals input into the X and Y input terminals is "00", "10" or "11", the timing logic module 100 is switched to the S2 state from the S1 state.

It should be noted that the timing logic module 100 may be implemented by many ways, and may include any circuit capable of performing the switching of the states specified in the present disclosure.

Figure 4:
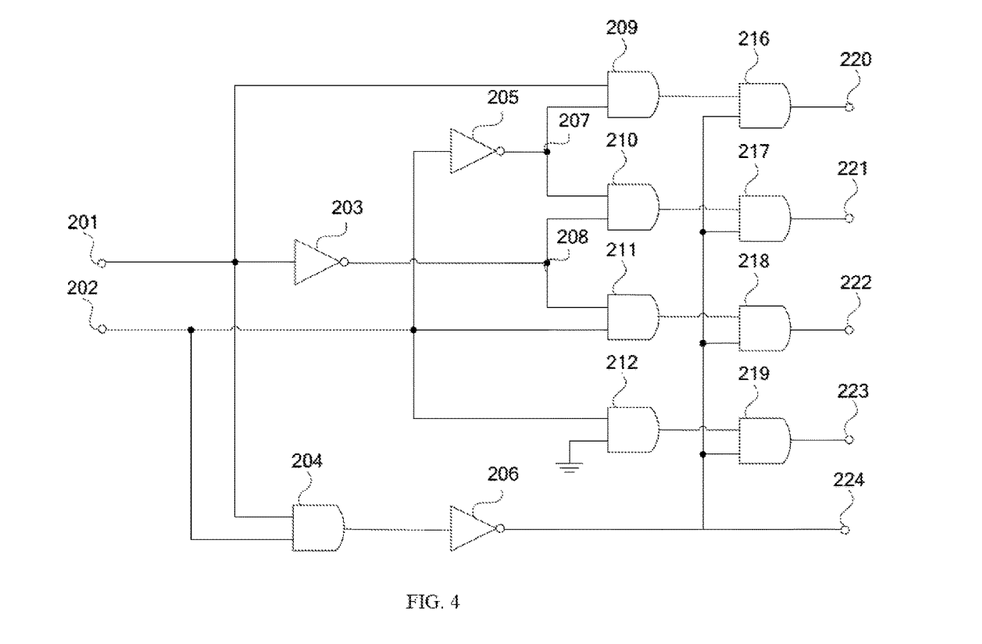
FIG. 4 is a schematic diagram illustrating logical relations of a control circuit module.

In one embodiment, referring to FIG. 4 which illustrates logical relations of a control circuit module, the control circuit module includes:

a first input terminal 201, a second input terminal 202, a first inverter 203, a first AND gate 204, a second inverter 205, a third inverter 206, a first junction 207, and a second junction 208, a second AND gate 209, a third AND gate 210, a fourth AND gate 211, a fifth AND gate 212, a sixth AND gate 216, a seventh AND gate 217, an eighth AND gate 218, a ninth AND gate 219, a first output terminal 220, a second output terminal 221, a third output terminal 222, a fourth output terminal 223, and a fifth output terminal 224;

an input terminal of the first inverter 203 is connected to the first input terminal 201, and an output terminal of the first inverter 203 is connected to the second junction 208;

one input terminal of the first AND gate 204 is connected to the first input terminal 201, another input terminal of the first AND gate 204 is connected to the second input terminal 202, and an output terminal of the first AND gate 204 is connected to an input terminal of the third inverter 206;

an input terminal of the second inverter 205 is connected to the second input terminal 202, and an output terminal of the second inverter 205 is connected to the first junction 207;

one input terminal of the second AND gate 209 is connected to the first input terminal 201, and another input terminal of the second AND gate 209 is connected to the first junction 207;

one input terminal of the third AND gate 210 is connected to the first junction 207, and another input terminal is connected to an output terminal of the first inverter 203;

one input terminal of the fourth AND gate 211 is connected to the second junction 208, and another input terminal of the fourth AND gate 211 is connected to the second input terminal 202;

one input terminal of the fifth AND gate 212 is connected to the second input terminal 202, and another input terminal of the fifth AND gate 212 grounded, one input terminal of the sixth AND gate 216 is connected to an output terminal of the second AND gate 209, and another input terminal of the sixth AND gate 216 is connected to the fifth output terminal 224;

one input terminal of the seventh AND gate 217 is connected to an output terminal of the third AND gate 210, and another input terminal of the seventh AND gate 217 is connected to a fifth output terminal 224;

one input terminal of the eighth AND gate 218 is connected to an output terminal of the AND gate 211, and another input terminal of the eighth AND gate 218 is connected to the fifth output terminal 224; and one input terminal of the AND gate 219 is connected to an output terminal of the AND gate 212, and another input terminal of the AND gate 219 is connected to the fifth output terminal 224.

Figure 5:
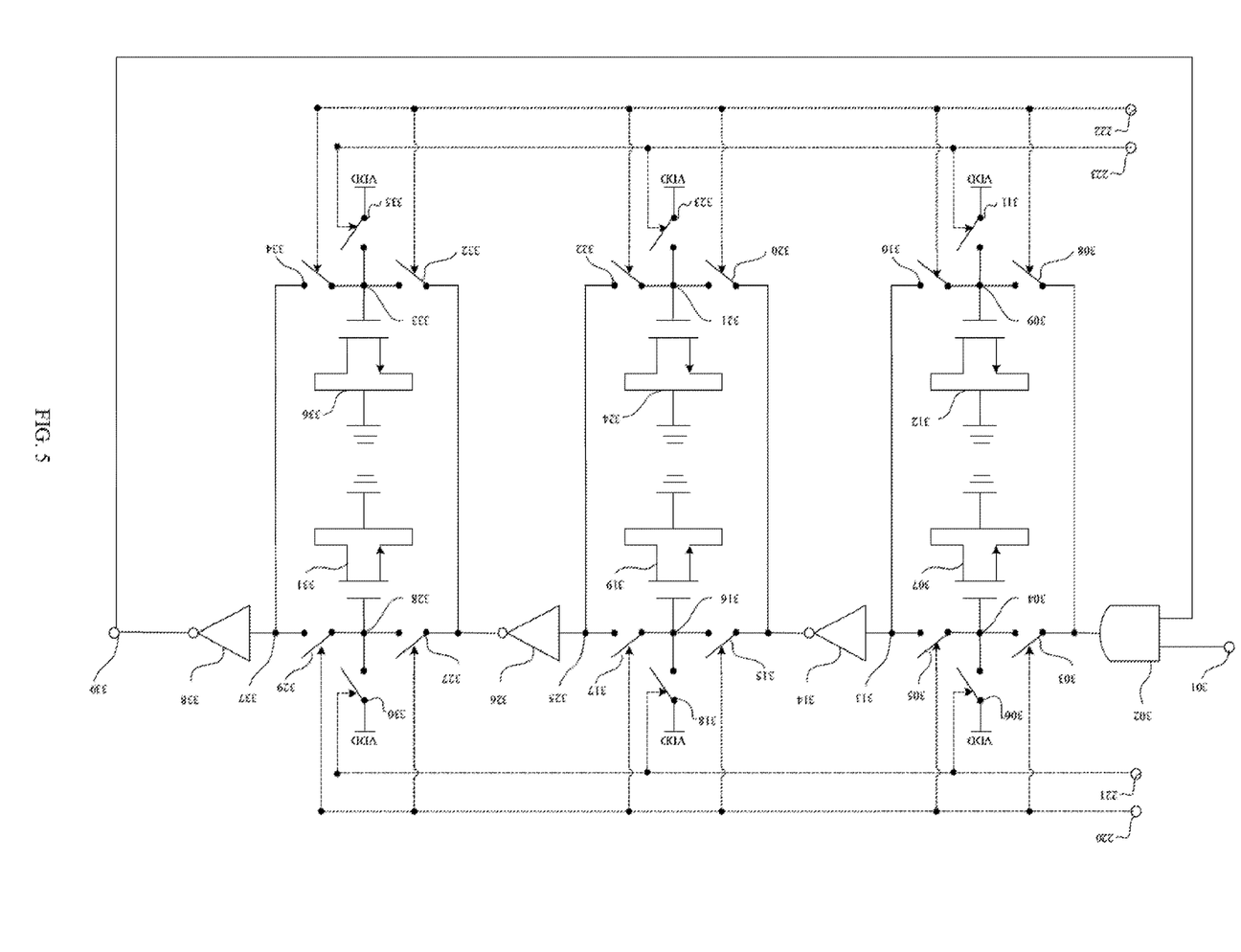
FIG. 5 is a structural schematic diagram illustrating a TDDB performance degradation digital conversion circuit.

In one embodiment, referring to FIG. 5 which is a structural schematic diagram illustrating a TDDB performance degradation digital conversion circuit, the TDDB performance degradation digital conversion circuit and includes:

a third input terminal 301, a tenth AND gate 302, a first switch 303, a third junction 304, a second switch 305, a third switch 306, a first NMOS transistor 307, a fourth switch 308, a fourth junction 309, a fifth switch 310, a sixth switch 311, a second NMOS transistor 312, a fifth junction 313, a first inverter 314, a seventh switch 315, a sixth junction 316, an eighth switch 317, a ninth switch 318, a third NMOS transistor 319, a tenth switch 320, a seventh junction 321, an eleventh switch 322, a twelfth switch 323, a fourth NMOS 324, an eighth junction 325, a second inverter 326, a thirteenth switch 327, a ninth junction 328, a fourteenth switch 329, a fifteenth switch 330, a fifth NMOS transistor 331, a sixteenth switch 332, a tenth junction 333, a seventeenth switch 334, an eighteenth switch 335, a sixth NMOS 336, an eleventh junction 337, a third inverter 338, and a sixth output terminal 339, wherein the third switch 306, the ninth switch 318 and the fifteenth switch 330 are connected to the first output terminal 220 respectively;

the first switch 303, the second switch 305, the seventh switch 315, the eighth switch 317, the thirteenth switch 327, and the fourteenth switch 329 are connected to the second output terminal 221 respectively;

the fourth switch 308, the fifth switch 310, the tenth switch 320, the eleventh switch 322, the sixteenth switch 332 and the seventeenth switch 334 are connected to the third output terminal 222 respectively;

the sixth switch 311, the twelfth switch 323 and the eighteenth switch 335 are connected to the fourth output terminal 223 respectively;

the fifth output terminal 224 is connected to the third input terminal 301;

one input terminal of the tenth AND gate 302 is connected to the third input terminal 301, another input terminal of the tenth AND gate 302 is connected to the sixth output terminal 339, and an output terminal of the tenth AND gate 302 is connected to the first switch 303;

one end of the first switch 303 is connected to an output terminal of the tenth AND gate 302, and another end of the first switch 303 is connected to the third junction 304;

one end of the third switch 306 is connected to the power supply VDD, and another end of the third switch 306 is connected to the third junction 304;

one end of the second switch 305 is connected to the third junction 304, and another end of the second switch 305 is connected to the fifth junction 313;

a gate terminal of the first NMOS transistor 307 is connected to the third junction 304, and a source terminal and a drain terminal of the first NMOS transistor 307 are grounded respectively;

one end of the fourth switch 308 is connected to an output terminal of the tenth AND gate 302, and another end of the fourth switch 308 is connected to the fourth junction 309;

one end of the sixth switch 311 is connected to the power supply VDD, and another end of the sixth switch 311 is connected to the fourth junction 309;

one end of the fifth switch 310 is connected to the fourth junction 309, and another end of the fifth switch 310 is connected to the fifth junction 313;

a gate terminal of the second NMOS transistor 312 is connected to the fourth junction 309, and a source terminal and a drain terminal of the second NMOS transistor 312 are grounded respectively;

an input terminal of the first inverter 314 is connected to the fifth junction 313, and an output terminal is connected to the seventh switch 315;

one end of the seventh switch 315 is connected to the output terminal of the first inverter 314, and another end of the seventh switch 315 is connected to the sixth junction 316;

one end of the ninth switch 318 is connected to a power supply VDD, and another end of the ninth switch 318 is connected to the sixth junction 316;

one end of the eighth switch 317 is connected to the sixth junction 316, and another end is connected to the eighth junction 325 respectively;

a gate terminal of the third NMOS transistor 319 is connected to the sixth junction 316, and a source terminal and a drain terminal of the third NMOS transistor 319 are grounded respectively;

one end of the tenth switch 320 is connected to the seventh junction 321, and another end of the tenth switch 320 is connected to an output terminal of the first inverter 314;

one end of the twelfth switch 323 is connected to the power supply VDD, and another end of the twelfth switch 323 is connected to the seventh junction 321;

one end of the eleventh switch 322 is connected to the seventh junction 321, and another end of the eleventh switch 322 is connected to the eighth junction 322;

a gate terminal of the fourth NMOS transistor 324 is connected to the seventh junction 321, and a source terminal and a drain terminal of the fourth NMOS transistor 324 are grounded respectively;

an input terminal of the second inverter 326 is connected to the eighth junction 325, and an output terminal is connected to the thirteenth switch 327;

one end of the thirteenth switch 327 is connected to an output terminal of the second inverter 326, and another end of the thirteenth switch 327 is connected to the ninth junction 328;

one end of the fifteenth switch 330 is connected to the power supply VDD, and another end of the fifteenth switch 330 is connected to the ninth junction 328;

one end of the fourteenth switch 329 is connected to the ninth junction 328, and another end of the fourteenth switch 329 is connected to the eleventh junction 337;

a gate terminal of the third NMOS transistor 331 is connected to the nine junction 328, and the source and drain terminals of the third NMOS transistor 331 are grounded;

one end of the sixteenth switch 332 is connected to an output terminal of the second inverter 326, and another end of the sixteenth switch 332 is connected to the tenth junction 333;

one end of the eighteenth switch 335 is connected to the power supply VDD, and another end of the eighteenth switch 335 is connected to the tenth junction 333;

one end of the seventeenth switch 334 is connected to the tenth junction 333, and another end of the seventeenth switch 334 is connected to the eleventh junction 337;

a gate terminal of the sixth NMOS transistor 336 is connected to the tenth junction 333, and a source terminal and a drain terminal of the sixth NMOS transistor 336 are grounded respectively; and an input terminal of the third inverter 338 is connected to the eleventh junction 337, and an output terminal of the third inverter 338 is connected to the sixth output terminal 339.

In the above embodiment, the number of inverters in the ring oscillation circuit of the digital conversion module for TDDB performance degradation 300 is 3, and in other embodiment, the number of inverters may be any odd number.

Figure 6:
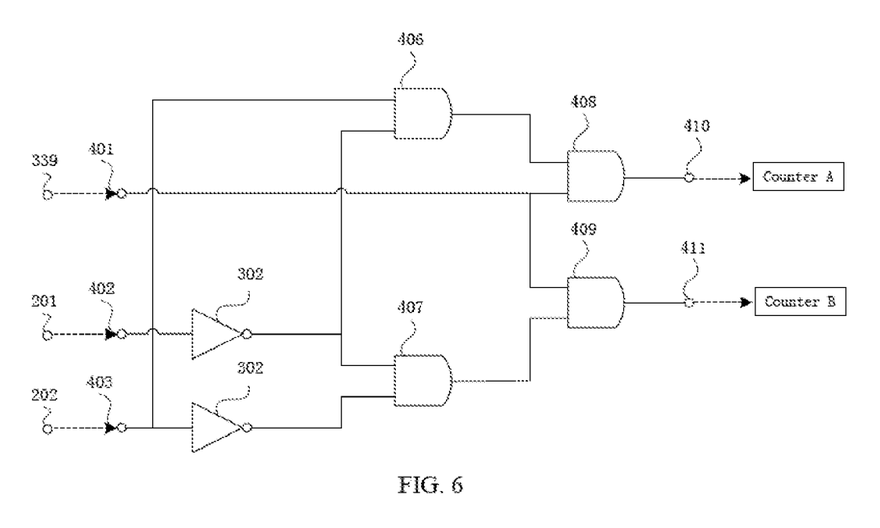
FIG. 6 is a structural schematic diagram illustrating a circuit of an output selection module.

In one embodiment, referring to FIG. 6, which is a structural schematic diagram illustrating a circuit of an output selection module. The output selection module 400 includes:

a fourth input terminal 401, a fifth input terminal 402, a sixth input terminal 403, a fifth inverter 404, a sixth inverter 405, an eleventh AND gate 406, a twelfth AND gate 407, a thirteenth AND gate 408, a fourteenth AND gate 409, a seventh output terminal 410, and an eighth output terminal 411, wherein the fourth input terminal 401 is connected to the sixth output terminal 339;

the fifth input terminal 402 is connected to the first input terminal 201;

the sixth input terminal 403 is connected to the second input terminal 202;

the seventh output terminal 410 is connected to the counter A for accessing the Q1 signal;

the eighth output terminal 411 is connected to the counter B for accessing the Q0 signal;

an input terminal of the fifth inverter 404 is connected to the fifth input terminal 402, and an input terminal of the sixth inverter 405 is connected to the sixth input terminal 403;

one input terminal of the eleventh AND gate 406 is connected to the sixth input terminal 403, and another end of the eleventh AND gate 406 is connected to an output terminal of the fifth inverter 404;

one input terminal of the twelfth AND gate 407 is connected to the output terminal of the fifth inverter 404, and another input terminal of the twelfth AND gate 407 is connected to an output terminal of the sixth inverter 405;

one input terminal of the thirteenth AND gate 408 is connected to the output terminal of the eleventh AND gate 406, another end of the thirteenth AND gate 408 is connected to the fourth input terminal 401, and an output terminal of the thirteenth AND gate 408 is connected to the seventh output terminal 410; and one input terminal of the fourteenth AND gate 409 is connected to the fourth input terminal 401, and another input terminal of the fourteenth AND gate 409 is connected to an output terminal of the twelfth AND gate 407, and an output terminal of fourteenth AND gate 409 is connected to the eighth output terminal 411.

In one embodiment, the timing logic module 100 is in a state switched among S0, S1, S2 and S3 states under control of the level voltage input into the X and Y input terminals. When the timing logic module 100 is in the S2 state, a combination of the Q1 and Q0 signals is "10", the first input terminal 201 is at a high level voltage of "1", the second input terminal 202 is at a low level voltage of "0", the first output terminal 220 is at the high level voltage of "1" to control the third switch 306, the ninth switch 318 and the fifteenth switch 330 to be switched on, the second output terminal 221 is at the low level voltage of "0" to control the first switch 303, the second switch 305, the seventh switch 315, the eighth switch 317, the thirteenth switch 327 and the fourteenth switch 329 to be switched off, the third output terminal 222 is at the low level voltage of "0" to control the fourth switch 308, the fifth switch 310, the tenth switch 320, the eleventh switch 322, the sixteenth switch 332 and the seventeenth switch 334 to be switched off, the fourth output terminal 223 is at the low level voltage of "0" to control the sixth switch 311, the twelfth switch 323 and the eighteenth switch 335 to be switched off, the fifth output terminal 224 is at the high level voltage of "1" and is connected to the third input terminal 301, and gate terminals of the first NMOS transistor 307, the third NMOS transistor 319 and the fifth NMOS transistor 331 are in a VDD voltage stress state.

In one embodiment, when the timing logic module 100 is in the S0 state, a combination of the Q1 and Q0 signals is "00", the first input terminal 201 is at a low level voltage of "0", the second input terminal 202 is at the low level voltage of "0", the first output terminal 220 is at the low level voltage of "0" to control the third switch 306, the ninth switch 318 and the fifteenth switch 330 to be switched off, the second output terminal 221 is at a high level voltage of "1" to control the first switch 303, the second switch 305, the seventh switch 315, the eighth switch 317, the thirteenth switch 327 and the fourteenth switch 329 to be switched on, the third output terminal 222 is at the low level voltage of "0" to control the fourth switch 308, the fifth switch 310, the tenth switch 320, the eleventh switch 322, the sixteenth switch 332 and the seventeenth switch 334 to be switched off, the fourth output terminal 223 is at the low level voltage of "0" to control the sixth switch 311, the twelfth switch 323 and the eighteenth switch 335 to be switched off, the fifth output terminal 224 is at the high level voltage of "1" and is connected to the third input terminal 301, the digital conversion module for TDDB performance degradation 300 is a circuit in an oscillation state, including the first NMOS transistor 307, the third NMOS transistor 319 and the fifth NMOS transistor 331, and the sixth output terminal 339 outputs a periodic signal with alternate high and low level voltage, with an oscillation frequency as the second frequency value.

In one embodiment, wherein when the timing logic module 100 is in the S1 state, a combination of the Q1 and Q0 signals is "01", the first input terminal 201 is at a low level voltage of "0", the second input terminal 202 is at a high level voltage of "1", the first output terminal 220 is at the low level voltage of "0" to control the third switch 306, the ninth switch 318 and the fifteenth switch 330 to be switched off, the second output terminal 221 is at the low level voltage of "0" to control the first switch 303, the second switch 305, the seventh switch 315, the eighth switch 317, the thirteenth switch 327 and the fourteenth switch 329 to be switched off, the third output terminal 222 is at the high level voltage of "1" to control the fourth switch 308, the fifth switch 310, the tenth switch 320, the eleventh switch 322, the sixteenth switch 332 and the seventeenth switch 334 to be switched on, the fourth output terminal 223 is at the low level voltage of "0" to control the sixth switch 311, the twelfth switch 323 and the eighteenth switch 335 to be switched off, the fifth output terminal 224 is at the high level voltage of "1" and is connected to the third input terminal 301, the digital conversion module for TDDB performance degradation 300 is a circuit in a oscillation state, including the second NMOS transistor 312, the 4rd NMOS transistor 324 and the sixth NMOS transistor 336, and the sixth output terminal 339 outputs a periodic signal with alternate high and low level voltage, with an oscillation frequency as the first frequency value.

In one embodiment, property of TDDB performance degradation is obtained by comparing the second frequency value in counter A with the first frequency value in counter B.

In the above embodiment, the timing logic module 100 outputs specific digital signals of Q1 and Q0, corresponding to a state selected from one of S0, S1, S2 and S3 states, under control of the X, Y and CP input signals. The control circuit module 200 converts the input signals Q1 and Q0 into the switch state control signals in the digital conversion module for TDDB performance degradation 300 to cause the digital conversion module for TDDB performance degradation 300 to be in the stress state, and to test and output the first frequency value or the second frequency value. The output selection module 400 outputs the first frequency value of the digital conversion module for TDDB performance degradation 300 to the counter B in the counter module 500, or outputs the second frequency value of the digital conversion module for TDDB performance degradation 300 to the counter A in the counter module 500, based on the digital signals of Q1 and Q0. The degradation level of TDDB performance can be obtained by comparing the second frequency value in the counter A with the first frequency value in the counter B. An early warming can be generated when the degradation level reaches a certain threshold.

The frequencies of the first NMOS transistor 307, the third NMOS transistor 319, the fifth NMOS transistor 331, the second NMOS transistor 312, the fourth NMOS transistor 324 and the sixth NMOS transistor 336 are the same in the initial phase. However, when the first NMOS transistor 307, the third NMOS transistor 319 and the fifth NMOS transistor 331 are under the action of the supply voltage VDD stress for a long time, the grid capacitance tends to cause TDDB degradation, while no supply voltage stress is applied on the second MOS transistor 312, the fourth NMOS transistor 324 and the sixth NMOS transistor 336 and there is no TDDB degradation, so the degradation level of TDDB performance can be detected by comparing the first frequency value with the second frequency value.

The technical features in the embodiments above may be implemented in any combination. For the purpose of simplicity, not all combinations are described herein. However, such combination should all be considered within the scope of the present disclosure provide that there is no contradiction.

The detailed embodiments described herein are only for the purpose of illustrating the present disclosure, and are not intended to limit the scope of the present disclosure in any way. It would be understand by a person skilled in the art that various changes and modifications can be made to the embodiments described herein without departing from the scope and spirit of the present disclosure. Such changes and modifications are contemplated by the present disclosure, the scope of which should only be defined by the following claims.

What is claimed is:

1. An on-chip TDDB degradation monitoring and failure early warning circuit for SoC, comprising: a timing logic module (100), a control circuit module (200), a digital conversion module for TDDB performance degradation (300), an output selection module (400) and a counter module (500), wherein the counter module (500) includes a counter A and a counter B; the digital conversion module for TDDB performance degradation (300) includes two same MOS transistor circuits including a first MOS transistor circuit and a second MOS transistor circuit;

the timing logic module (100) includes X, Y and CP signal input terminals and Q1 and Q0 output terminals, and the timing logic module is configured to output the Q1 and Q0 signals with a high or low level voltage to the control circuit module (200) under control of input X, Y and CP signals;

the control circuit module (200) is configured to convert the Q1 and Q0 signals into a switch state control signal and outputs the switch state control signal to the digital conversion module for TDDB performance degradation (300);

a MOS transistor of the first MOS transistor circuit is in a stress state of the supply voltage and a MOS transistor of the second MOS transistor circuit is in a non-stress state within the digital conversion module for TDDB performance degradation (300); the first and the second MOS transistor circuits output a first and second frequency value to the output selection module (400) respectively, under control of the switch state control signal;

the output selection module (400) is configured to output the first frequency value from the digital conversion module for TDDB performance degradation (300) to the counter B for recording, or output the second frequency value from the digital conversion module for TDDB performance degradation to the counter A for recording; and the counter module (500) is configured to determine a degradation level of TDDB performance by comparing the first frequency value with the second frequency value.

2. The on-chip TDDB degradation monitoring and failure early warning circuit for SoC of claim 1, wherein the Q1 and Q0 signals correspond to a state selected from an S0 state, an S1 state, an S2 state, and an S3 state; when the Q1 output terminal is "0" and the Q0 output terminal is "0", the S0 state is a corresponding state; when the Q1 output terminal is "0" and the Q0 output terminal is "1", the S1 state is a corresponding state; when the Q1 output terminal is "1" and the Q0 output terminal is "0", the S2 state is a corresponding state; and when the Q1 output terminal is "1" and the Q0 output terminal is "1", the S3 state is a corresponding state.

3. The on-chip TDDB degradation monitoring and failure early warning circuit for SoC of claim 2, wherein when the timing logic module (100) is in the S3 state, the timing logic module (100) is switched to the S2 state under any level voltage input from the X and Y input terminals;

when the timing logic module (100) is in the S2 state and a combination of signals input into the X and Y input terminals is any one of "00", "01", and "10", the timing logic module (100) continues to be in the S2 state;

when the timing logic module (100) is in the S2 state and the combination of signals input into the X and Y input terminals is "11", the timing logic module (100) is switched to the S0 state from the S2 state;

when the timing logic module (100) is in the S0 state and the combination of signals input into the X and Y input terminals is "01", the timing logic module (100) continues to be in the S2 state;

when the timing logic module (100) is in the S0 state and the combination of signals input into the X and Y input terminals is "00" or "10", the timing logic module (100) is switched to the S2 state from the S0 state;

when the timing logic module (100) is in the S0 state and the combination of signals input into the X and Y input terminals is "11", the timing logic module (100) is switched to the S1 state from the S0 state;

when the timing logic module (100) is in the S1 state and the combination of signals input into the X and Y input terminals is "01", the timing logic module (100) continues to be in the S1 state; and when the timing logic module (100) is in the S1 state and the combination of signals input into the X and Y input terminals is "00", "10" or "11", the timing logic module (100) is switched to the S2 state from the S1 state.

4. The on-chip TDDB degradation monitoring and failure early warning circuit for SoC of claim 1, wherein the control circuit module (200) includes:

a first input terminal (201), a second input terminal (202), a first inverter (203), a first AND gate (204), a second inverter (205), a third inverter (206), a first junction (207), and a second junction (208), a second AND gate (209), a third AND gate (210), a fourth AND gate (211), a fifth AND gate (212), a sixth AND gate (216), a seventh AND gate (217), an eighth AND gate (218), a ninth AND gate (219), a first output terminal (220), a second output terminal (221), a third output terminal (222), a fourth output terminal (223), and a fifth output terminal (224);

an input terminal of the first inverter (203) is connected to the first input terminal (201), and an output terminal of the first inverter (203) is connected to the second junction (208);

one input terminal of the first AND gate (204) is connected to the first input terminal (201), another input terminal of the first AND gate (204) is connected to the second input terminal (202), and an output terminal of the first AND gate (204) is connected to an input terminal of the third inverter (206);

an input terminal of the second inverter (205) is connected to the second input terminal (202), and an output terminal of the second inverter (205) is connected to the first junction (207);

one input terminal of the second AND gate (209) is connected to the first input terminal (201), and another input terminal of the second AND gate (209) is connected to the first junction (207);

one input terminal of the third AND gate (210) is connected to the first junction (207), and another input terminal of the third AND gate (210) is connected to an output terminal of the first inverter (203);

one input terminal of the fourth AND gate (211) is connected to the second junction (208), and another input terminal of the fourth AND gate (211) is connected to the second input terminal (202);

one input terminal of the fifth AND gate (212) is connected to the second input terminal (202), and another input terminal of the fifth AND gate (212) grounded, one input terminal of the sixth AND gate (216) is connected to an output terminal of the second AND gate (209), and another input terminal of the sixth AND gate (216) is connected to the fifth output terminal (224);

one input terminal of the seventh AND gate (217) is connected to an output terminal of the third AND gate (210), and another input terminal of the seventh AND gate (217) is connected to a fifth output terminal (224);

one input terminal of the eighth AND gate (218) is connected to an output terminal of the AND gate (211), and another input terminal of the eighth AND gate (218) is connected to the fifth output terminal (224); and one input terminal of the AND gate (219) is connected to an output terminal of the AND gate (212), and another input terminal of the AND gate (219) is connected to the fifth output terminal (224).

5. The on-chip TDDB degradation monitoring and failure early warning circuit for SoC of claim 1, wherein the digital conversion module for TDDB performance degradation (300) includes:

a third input terminal (301), a tenth AND gate (302), a first switch (303), a third junction (304), a second switch (305), a third switch (306), a first NMOS transistor (307), a fourth switch (308), a fourth junction (309), a fifth switch (310), a sixth switch (311), a second NMOS transistor (312), a fifth junction (313), a first inverter (314), a seventh switch (315), a sixth junction (316), an eighth switch (317), a ninth switch (318), a third NMOS transistor (319), a tenth switch (320), a seventh junction (321), an eleventh switch (322), a twelfth switch (323), a fourth NMOS (324), an eighth junction (325), a second inverter (326), a thirteenth switch (327), a ninth junction (328), a fourteenth switch (329), a fifteenth switch (330), a fifth NMOS transistor (331), a sixteenth switch (332), a tenth junction (333), a seventeenth switch (334), an eighteenth switch (335), a sixth NMOS (336), an eleventh junction (337), a third inverter (338), and a sixth output terminal (339), wherein the third switch (306), the ninth switch (318) and the fifteenth switch (330) are connected to the first output terminal (220) respectively;

the first switch (303), the second switch (305), the seventh switch (315), the eighth switch (317), the thirteenth switch (327), and the fourteenth switch (329) are connected to the second output terminal (221) respectively;

the fourth switch (308), the fifth switch (310), the tenth switch (320), the eleventh switch (322), the sixteenth switch (332) and the seventeenth switch (334) are connected to the third output terminal (222) respectively;

the sixth switch (311), the twelfth switch (323) and the eighteenth switch (335) are connected to the fourth output terminal (223) respectively;

the fifth output terminal (224) is connected to the third input terminal (301);

one input terminal of the tenth AND gate (302) is connected to the third input terminal (301), another input terminal of the tenth AND gate (302) is connected to the sixth output terminal (339), and an output terminal of the tenth AND gate (302) is connected to the first switch (303);

one end of the first switch (303) is connected to an output terminal of the tenth AND gate (302), and another end of the first switch (303) is connected to the third junction (304);

one end of the third switch (306) is connected to the power supply VDD, and another end of the third switch (306) is connected to the third junction (304);

one end of the second switch (305) is connected to the third junction (304), and another end of the second switch (305) is connected to the fifth junction (313);

a gate terminal of the first NMOS transistor (307) is connected to the third junction (304), and a source terminal and a drain terminal of the first NMOS transistor (307) are grounded respectively;

one end of the fourth switch (308) is connected to an output terminal of the tenth AND gate (302), and another end of the fourth switch (308) is connected to the fourth junction (309);

one end of the sixth switch (311) is connected to the power supply VDD, and another end of the sixth switch (311) is connected to the fourth junction (309);

one end of the fifth switch (310) is connected to the fourth junction (309), and another end of the fifth switch (310) is connected to the fifth junction (313);

a gate terminal of the second NMOS transistor (312) is connected to the fourth junction (309), and a source terminal and a drain terminal of the second NMOS transistor (312) are grounded respectively;

an input terminal of the first inverter (314) is connected to the fifth junction (313), and an output terminal is connected to the seventh switch (315);

one end of the seventh switch (315) is connected to the output terminal of the first inverter (314), and another end of the seventh switch (315) is connected to the sixth junction (316);

one end of the ninth switch (318) is connected to a power supply VDD, and another end of the ninth switch (318) is connected to the sixth junction (316);

one end of the eighth switch (317) is connected to the sixth junction (316), and another end is connected to the eighth junction (325) respectively;

a gate terminal of the third NMOS transistor (319) is connected to the sixth junction (316), and a source terminal and a drain terminal of the third NMOS transistor (319) are grounded respectively;

one end of the tenth switch (320) is connected to the seventh junction (321), and another end of the tenth switch (320) is connected to an output terminal of the first inverter (314);

one end of the twelfth switch (323) is connected to the power supply VDD, and another end of the twelfth switch (323) is connected to the seventh junction (321);

one end of the eleventh switch (322) is connected to the seventh junction (321), and another end of the eleventh switch (322) is connected to the eighth junction (322);

a gate terminal of the fourth NMOS transistor (324) is connected to the seventh junction (321), and a source terminal and a drain terminal of the fourth NMOS transistor (324) are grounded respectively;

an input terminal of the second inverter (326) is connected to the eighth junction (325), and an output terminal is connected to the thirteenth switch (327);

one end of the thirteenth switch (327) is connected to an output terminal of the second inverter (326), and another end of the thirteenth switch (327) is connected to the ninth junction (328);

one end of the fifteenth switch (330) is connected to the power supply VDD, and another end of the fifteenth switch (330) is connected to the ninth junction (328);

one end of the fourteenth switch (329) is connected to the ninth junction (328), and another end of the fourteenth switch (329) is connected to the eleventh junction (337);

a gate terminal of the third NMOS transistor (331) is connected to the ninth junction (328), and the source and drain terminals of the third NMOS transistor (331) are grounded;

one end of the sixteenth switch (332) is connected to an output terminal of the second inverter (326), and another end of the sixteenth switch (332) is connected to the tenth junction (333);

one end of the eighteenth switch (335) is connected to the power supply VDD, and another end of the eighteenth switch (335) is connected to the tenth junction (333);

one end of the seventeenth switch (334) is connected to the tenth junction (333), and another end of the seventeenth switch (334) is connected to the eleventh junction (337);

a gate terminal of the sixth NMOS transistor (336) is connected to the tenth junction (333), and a source terminal and a drain terminal of the sixth NMOS transistor (336) are grounded respectively; and an input terminal of the third inverter (338) is connected to the eleventh junction (337), and an output terminal of the third inverter (338) is connected to the sixth output terminal (339).

6. The on-chip TDDB degradation monitoring and failure early warning circuit for SoC of claim 1, wherein the output selection module (400) includes:

a fourth input terminal (401), a fifth input terminal (402), a sixth input terminal (403), a fifth inverter (404), a sixth inverter (405), an eleventh AND gate (406), a twelfth AND gate (407), a thirteenth AND gate (408), a fourteenth AND gate (409), a seventh output terminal (410), and an eighth output terminal (411), wherein the fourth input terminal (401) is connected to the sixth output terminal (339);

the fifth input terminal (402) is connected to the first input terminal (201);

the sixth input terminal (403) is connected to the second input terminal (202);

the seventh output terminal (410) is connected to the counter A for accessing the Q1 signal;

the eighth output terminal (411) is connected to the counter B for accessing the Q0 signal;

an input terminal of the fifth inverter (404) is connected to the fifth input terminal (402), and an input terminal of the sixth inverter (405) is connected to the sixth input terminal (403);

one input terminal of the eleventh AND gate (406) is connected to the sixth input terminal (403), and another end of the eleventh AND gate (406) is connected to an output terminal of the fifth inverter (404);

one input terminal of the twelfth AND gate (407) is connected to the output terminal of the fifth inverter (404), and another input terminal of the twelfth AND gate (407) is connected to an output terminal of the sixth inverter (405);

one input terminal of the thirteenth AND gate (408) is connected to the output terminal of the eleventh AND gate (406), another end of the thirteenth AND gate (408) is connected to the fourth input terminal (401), and an output terminal of the thirteenth AND gate (408) is connected to the seventh output terminal (410); and one input terminal of the fourteenth AND gate (409) is connected to the fourth input terminal (401), and another input terminal of the fourteenth AND gate (409) is connected to an output terminal of the twelfth AND gate (407), and an output terminal of fourteenth AND gate (409) is connected to the eighth output terminal (411).

7. The on-chip TDDB degradation monitoring and failure early warning circuit for SoC of claim 1, wherein the timing logic module (100) is in a state switched among S0, S1, S2 and S3 states under control of the level voltage input into the X and Y input terminals; when the timing logic module (100) is in the S2 state, a combination of the Q1 and Q0 signals is "10", the first input terminal (201) is at a high level voltage of "1", the second input terminal (202) is at a low level voltage of "0", the first output terminal (220) is at the high level voltage of "1" to control the third switch (306), the ninth switch (318) and the fifteenth switch (330) to be switched on, the second output terminal (221) is at the low level voltage of "0" to control the first switch (303), the second switch (305), the seventh switch (315), the eighth switch (317), the thirteenth switch (327) and the fourteenth switch (329) to be switched off, the third output terminal (222) is at the low level voltage of "0" to control the fourth switch (308), the fifth switch (310), the tenth switch (320), the eleventh switch (322), the sixteenth switch (332) and the seventeenth switch (334) to be switched off, the fourth output terminal (223) is at the low level voltage of "0" to control the sixth switch (311), the twelfth switch (323) and the eighteenth switch (335) to be switched off, the fifth output terminal (224) is at the high level voltage of "1" and is connected to the third input terminal (301), and gate terminals of the first NMOS transistor (307), the third NMOS transistor (319) and the fifth NMOS transistor (331) are in a VDD voltage stress state.

8. The on-chip TDDB degradation monitoring and failure early warning circuit for SoC of claim 1, wherein when the timing logic module (100) is in the S0 state, a combination of the Q1 and Q0 signals is "00", the first input terminal (201) is at a low level voltage of "0", the second input terminal (202) is at the low level voltage of "0", the first output terminal (220) is at the low level voltage of "0" to control the third switch (306), the ninth switch (318) and the fifteenth switch (330) to be switched off, the second output terminal (221) is at a high level voltage of "1" to control the first switch (303), the second switch (305), the seventh switch (315), the eighth switch (317), the thirteenth switch (327) and the fourteenth switch (329) to be switched on, the third output terminal (222) is at the low level voltage of "0" to control the fourth switch (308), the fifth switch (310), the tenth switch (320), the eleventh switch (322), the sixteenth switch (332) and the seventeenth switch (334) to be switched off, the fourth output terminal (223) is at the low level voltage of "0" to control the sixth switch (311), the twelfth switch (323) and the eighteenth switch (335) to be switched off, the fifth output terminal (224) is at the high level voltage of "1" and is connected to the third input terminal (301), the digital conversion module for TDDB performance degradation (300) is a circuit in an oscillation state, including the first NMOS transistor (307), the third NMOS transistor (319) and the fifth NMOS transistor (331), and the sixth output terminal (339) outputs a periodic signal with alternate high and low level voltage, with an oscillation frequency as the second frequency value.

9. The on-chip TDDB degradation monitoring and failure early warning circuit for SoC of claim 1, wherein when the timing logic module (100) is in the S1 state, a combination of the Q1 and Q0 signals is "01", the first input terminal (201) is at a low level voltage of "0", the second input terminal (202) is at a high level voltage of "1", the first output terminal (220) is at the low level voltage of "0" to control the third switch (306), the ninth switch (318) and the fifteenth switch (330) to be switched off, the second output terminal (221) is at the low level voltage of "0" to control the first switch (303), the second switch (305), the seventh switch (315), the eighth switch (317), the thirteenth switch (327) and the fourteenth switch (329) to be switched off, the third output terminal (222) is at the high level voltage of "1" to control the fourth switch (308), the fifth switch (310), the tenth switch (320), the eleventh switch (322), the sixteenth switch (332) and the seventeenth switch (334) to be switched on, the fourth output terminal (223) is at the low level voltage of "0" to control the sixth switch (311), the twelfth switch (323) and the eighteenth switch (335) to be switched off, the fifth output terminal (224) is at the high level voltage of "1" and is connected to the third input terminal (301), the digital conversion module for TDDB performance degradation (300) is a circuit in a oscillation state, including the second NMOS transistor (312), the 4rd NMOS transistor (324) and the sixth NMOS transistor (336), and the sixth output terminal (339) outputs a periodic signal with alternate high and low level voltage, with an oscillation frequency as the first frequency value.

10. The on-chip TDDB degradation monitoring and failure early warning circuit for SoC of claim 1, wherein property of TDDB performance degradation is obtained by comparing the second frequency value in counter A with the first frequency value in counter B.

\* \* \* \* \*